(12) United States Patent
Ng et al.

(10) Patent No.: US 11,518,177 B2
(45) Date of Patent: *Dec. 6, 2022

(54) DISPOSING MEMORY BANKS AND SELECT REGISTER

(71) Applicant: HEWLETT-PACKARD DEVELOPMENT COMPANY, L.P., Spring, TX (US)

(72) Inventors: Boon Bing Ng, Vancouver, WA (US); Noorashekin Binte Jamil, Singapore (SG)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/223,239

(22) Filed: Apr. 6, 2021

(65) Prior Publication Data
US 2021/0221144 A1 Jul. 22, 2021

Related U.S. Application Data

(63) Continuation of application No. 16/480,127, filed as application No. PCT/US2017/015836 on Jan. 31, 2017, now Pat. No. 10,974,515.

(51) Int. Cl.
*B41J 2/175* (2006.01)
*B41J 2/045* (2006.01)
*G11C 5/02* (2006.01)
*G11C 16/08* (2006.01)
*G11C 16/24* (2006.01)

(52) U.S. Cl.
CPC ....... *B41J 2/17546* (2013.01); *B41J 2/04521* (2013.01); *B41J 2/04541* (2013.01); *G11C 5/025* (2013.01); *G11C 16/08* (2013.01); *G11C 16/24* (2013.01); *B41J 2202/13* (2013.01); *B41J 2202/17* (2013.01)

(58) Field of Classification Search
CPC ................ B41J 2/04541; B41J 2/17546; B41J 2202/17; B41J 2/04543; B41J 2202/13; B41J 2/04521; B41J 2/04548; G11C 5/025; G11C 16/08; G11C 16/24; G11C 8/12
See application file for complete search history.

(56) References Cited

U.S. PATENT DOCUMENTS 6,022,094 A 2/2000 Gibson et al.
6,418,068 B1 * 7/2002 Raynham ............... G11C 29/76
714/E11.034
(Continued)

FOREIGN PATENT DOCUMENTS

CN 105940454 9/2016
EP 3100273 12/2016
(Continued)

*Primary Examiner* — Jannelle M Lebron
(74) *Attorney, Agent, or Firm* — Steven L. Nichols; Fabian VanCott

(57) ABSTRACT

The present subject matter relates to disposing memory banks and select register. In an example implementation, a plurality of memory banks is arranged to form a group of memory banks. Each memory bank includes a plurality of memory units. At least one select register generates a select signal to access the memory units in the plurality of memory banks. The at least one select register is disposed at an end of the group of memory banks.

20 Claims, 6 Drawing Sheets

(56) References Cited

U.S. PATENT DOCUMENTS

| | | | |
|---|---|---|---|
| 6,470,433 B1 * | 10/2002 | Prouty | ............... G11C 7/12 |
| | | | 711/170 |
| 6,607,257 B2 | 8/2003 | Szumla et al. | |
| 6,905,185 B2 | 6/2005 | Nakayama | |
| 8,864,260 B1 | 10/2014 | Ge et al. | |
| 10,974,515 B2 * | 4/2021 | Ng | ............... B41J 2/17546 |
| 2006/0072952 A1 | 4/2006 | Silverbrook | |
| 2008/0123461 A1 | 5/2008 | Kim | |
| 2010/0302293 A1 | 12/2010 | Torgerson et al. | |
| 2013/0250710 A1 | 9/2013 | Nakano | |
| 2015/0197083 A1 | 7/2015 | Otsuka | |

FOREIGN PATENT DOCUMENTS

| | | |
|---|---|---|
| JP | 2002-014870 A | 1/2002 |
| WO | WO-2009096940 | 8/2009 |
| WO | WO-2015108527 | 7/2015 |
| WO | WO-2015167477 | 11/2015 |
| WO | WO-2016018299 | 2/2016 |

* cited by examiner

DISPOSING MEMORY BANKS AND SELECT REGISTER

BACKGROUND

A memory bank is a collection of memory units, and is used to store information. A memory bank may be used on a fluid ejection die, such as a print head, to store a variety of information related to a print cartridge, print head, and the like. A memory unit in the memory bank can be selected to write information or read information. The selection of the memory unit may be performed using one or more select registers.

BRIEF DESCRIPTION OF DRAWINGS

The following detailed description references the figures, wherein.

DETAILED DESCRIPTION

Figure 1:
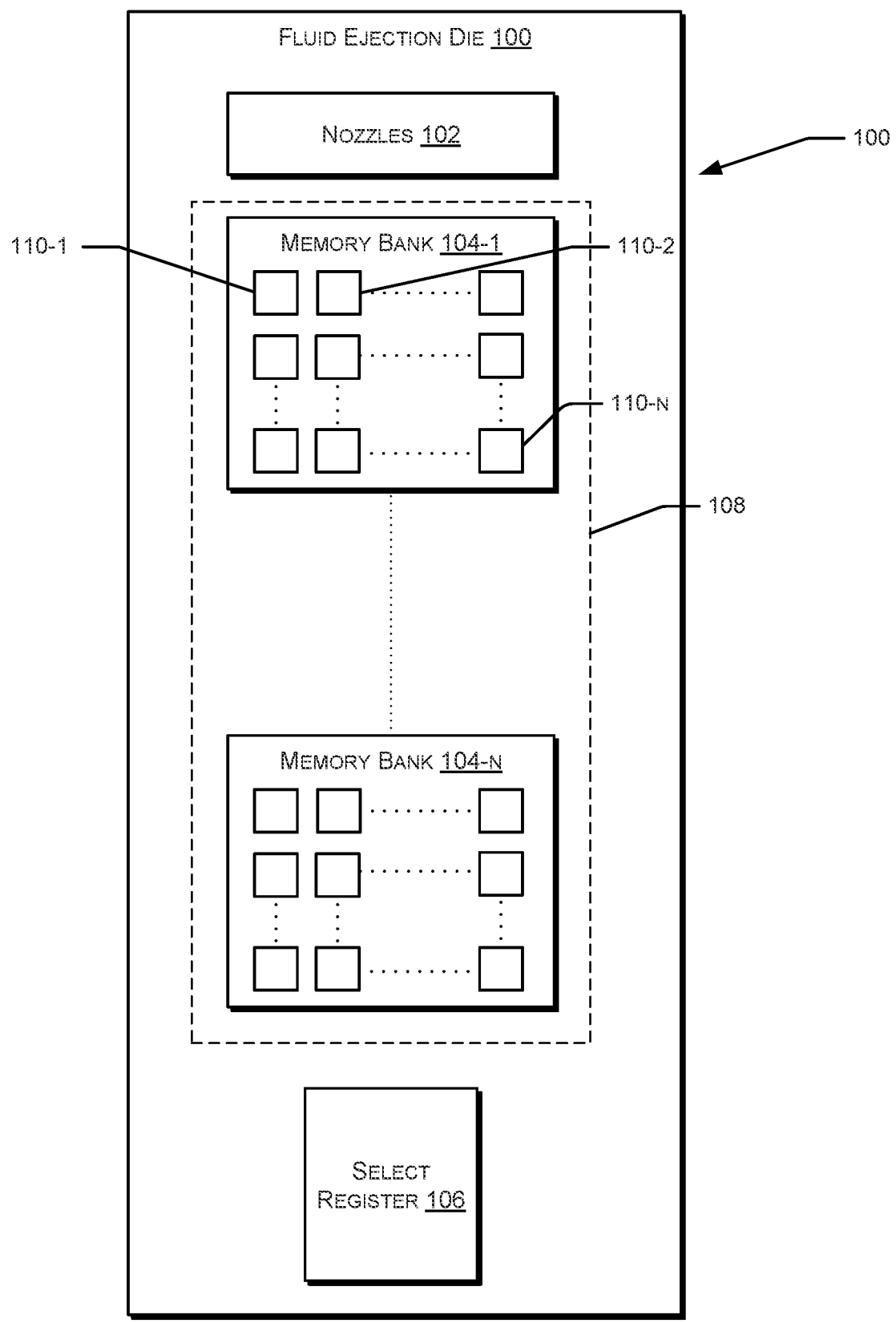
FIG. 1 illustrates a fluid ejection die, according to an example implementation of the present subject matter.

Memory banks may be used in a fluid ejection die, such as a print head, to store various information related to the fluid ejection die, such as identification information, serial numbers, security information, feature enhancement information, and the like. Since the memory bank includes a plurality of memory units, in order to read or write data to a memory unit in the memory bank, the memory unit is to be selected prior to the reading or writing operation. The selection of the memory unit may be achieved with the help of one or more registers, also referred to as select registers. The select registers may generate select signals to select the memory unit.

When a large amount of data is to be stored in a device, multiple memory banks may be used in the device, as a single memory bank may not be able to accommodate the data to be stored. For example, a print head may use a large amount of data in order to implement a wide variety of functions. Therefore, several memory banks may be used in the print head.

In order to select a memory unit in a memory bank of the several memory banks, one or more select registers may provide select signals to identify the memory unit to be selected.

The present subject matter relates to aspects of disposing memory banks and select registers. Implementations of the present subject matter provide an efficient layout that minimizes the amount of space consumed, for example, in a fluid ejection die, for implementing the various select registers.

In accordance with an example implementation of the present subject matter, a fluid ejection die, which may be part of a fluid cartridge, includes a plurality of memory banks arranged to form a group of memory banks. Each memory bank may include a plurality of memory units. Further, at least one select register is provided at an end of the group of memory banks. The select register generates select signals to access the memory units in the plurality of memory banks.

In accordance with an example of the present subject matter, each memory bank includes a plurality of memory units arranged in rows and columns. Further, a plurality of select registers may be provided to select a row of memory units, a column of memory units, and a memory bank of the plurality of memory banks. The plurality of select registers is disposed together, as a group of select registers, adjacent to an end, such as top end or bottom end, of the plurality of memory banks.

The select signals from the plurality of select registers may be provided to the plurality of memory banks using selection lines. The selection line from each select register may be provided on the same side of the group of memory banks.

The present subject matter provides an efficient layout that minimizes the amount of space consumed in utilizing the above mentioned select registers. Since the select register is disposed at an end of the plurality of memory banks, the input signals provided to the select register are routed at the end of the plurality of memory banks. Therefore, the input signal lines may not be provided beside the plurality of memory banks. The elimination of routing of the input signals beside the memory banks reduces the size of the circuitry implementing the memory bank and hence may reduce the size of an electronic device as well. Therefore, the techniques of the present subject matter can reduce dimensions of devices, such as print heads.

Further, when a plurality of select registers is used, the placement of the select registers at the end of the memory banks, instead of throughout the length for which the memory banks extend, results in the input signals being routed for a short length. The reduction in the length of the input signals routing reduces parasitic impact arising out of signal routing. Still further, by disposing the select registers at an end of the memory banks, the input signal lines to the select registers are away from the memory banks and the signal lines that are connected to the memory banks. This reduces the interference to the memory banks and their signal lines from the input signal lines and vice versa.

The following description refers to the accompanying drawings. Wherever possible, the same reference numbers are used in the drawings and the following description to refer to the same or similar parts. While several examples are described in the description, modifications, adaptations, and other implementations are possible. Accordingly, the following detailed description does not limit the disclosed examples. Instead, the proper scope of the disclosed examples may be defined by the appended claims.

Example implementations of the present subject matter are described with regard to memory banks used in fluid ejection dies, such as print heads. Although not described, it will be understood that the implementations of the present subject matter can be used with other types of fluid ejection dies where select registers are used for accessing memory units in memory banks.

FIG. 1 illustrates a fluid ejection die 100, according to an example implementation of the present subject matter. Example of the fluid ejection die 100 includes, but is not limited to, a print head, such as a thermal inkjet (TIJ) print head and a piezoelectric inkjet print head. The fluid ejection die 100 ejects drops of fluid, such as ink and liquid toner, through a plurality of orifices or nozzles 102 toward a print medium (not shown in FIG. 1), so as to print onto the print medium. The print medium can be any type of suitable sheet material, such as paper, card stock, fabric, and the like. Typically, the nozzles 102 are arranged in one or more columns or arrays such that properly sequenced ejection of fluid from the nozzles 102 causes characters, symbols, and/or other graphics or images to be printed upon print medium.

The fluid ejection die 100 also includes a plurality of memory banks 104-1, . . . , 104-n (collectively referred to as memory banks 104). The memory banks 104 can store a variety of information about a device on which they are used. For example, if the fluid ejection die 100 is a print head, the memory units in the memory banks 104 can be used to store information related to the print head, an integrated print head assembly, and the like. The information stored may be, for example, identification information, such as identification of the print head, type of ink cartridge, and kind of ink contained in the ink cartridge, serial numbers, security information, feature enhancement information, and the like. Based on the information stored in the memory banks 104, a printer controller (not shown in FIG. 1) in the printer (not shown in FIG. 1) that includes the fluid ejection die 100 may take one or more actions, such as altering printing routines to maintain image quality.

The memory banks 104 are arranged together to form a group 108 of memory banks. Each of the memory banks 104 may have several memory units. For instance, the memory bank 104-1 includes memory units 110-1, 110-2, . . . , 110-n. in order to access a memory unit in the memory banks 104, the fluid ejection die 100 includes at least one select register 106. The select register 106 generates a select signal to access the memory units in the memory banks 104. The select register 106 can be, for example, a shift register. The select register 106 is disposed at an end of the group 108 of memory banks 104. For example, the select register 106 can be disposed at a bottom end of the group 108 of memory banks 104 or at a top end of the group 108 of memory banks 104. The nozzles 102 may be arranged in any location on the fluid ejection die 100. For example, the nozzles 102 may be arranged at a top end or a bottom end of the group 108 of memory banks 104.

In an implementation, the memory units are electrically programmable read only memory EM memory units. The term "EM memory unit", as used in the present specification, is to be broadly understood as any programmable read-only memory that retains its data when its power supply is switched off. In an example, the EM is an erasable programmable read only memory (EPROM). In another example, the EM is an electrically erasable programmable read only memory (EEPROM).

Since the select register 106 is provided at an end of the group 108 of memory banks 104, the input signal lines (not shown in FIG. 1) to the select register 106 may not be provided beside the memory banks 104. Therefore, an increase in dimensions of the fluid ejection die 100 due to provision of the input signal lines is avoided. Further, by not providing of the input signal lines beside the group 108 of memory banks 104, the parasitic impact on the memory banks 104 due to the input signal lines and vice versa is prevented.

The above described implementations will be explained in greater detail in the subsequent paragraphs.

Figure 2A:
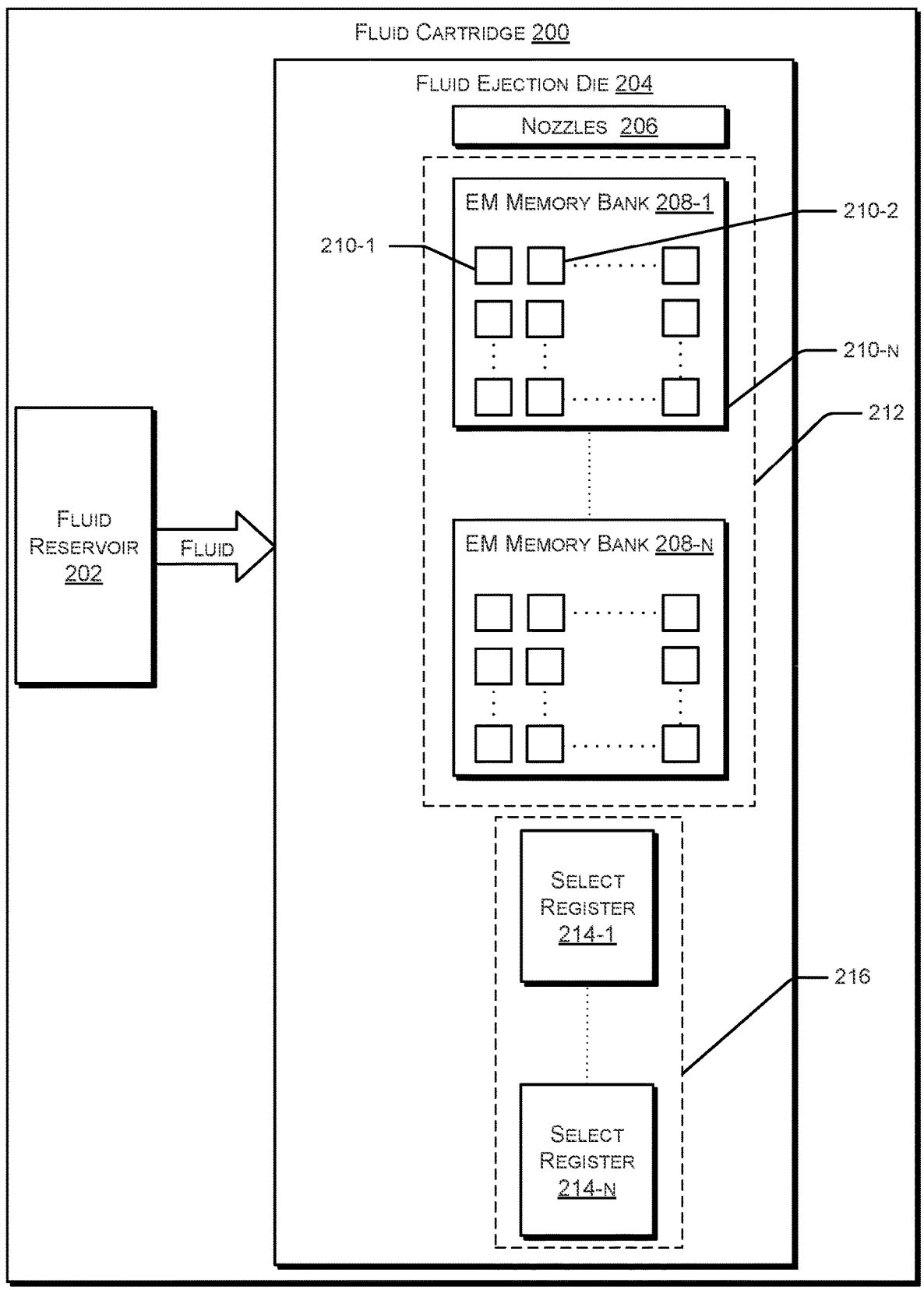
FIG. 2(a) illustrates a fluid cartridge including a fluid ejection die, according to an example implementation of the present subject matter.

FIG. 2(a) illustrates a fluid cartridge 200, according to an example implementation of the present subject matter. The fluid cartridge 200 is more generally a fluid-jet precision-dispensing device or fluid ejector structure that precisely dispenses fluid, such as ink and liquid toner. In an example, the fluid cartridge 200 may be a print cartridge, such as an ink cartridge for a fluid-jet printer.

While the present description describes generally an inkjet-printing cartridge that ejects ink onto media, examples of the present specification may not be limited to inkjet printing cartridges alone. In general, examples of the present specification pertain to any type of fluid-jet precision-dispensing or ejection devices that dispense a fluid. In The term fluid is meant to be broadly interpreted as any substance that deforms under an applied force. Examples of fluids, therefore, include liquids and gases. A fluid-jet precision-dispensing device is a device in which printing, or dispensing, of the fluid in question is achieved by precisely printing or dispensing in accurately specified locations, with or without making a particular image on that which is being printed or dispensed on. Thus, for purposes of explanation, a print cartridge or ink cartridge will be described. However, it will be understood that any type of fluid cartridge may be used with the principles described herein.

In an implementation, the fluid cartridge 200 includes a fluid reservoir 202 to store a fluid, such as ink and liquid toner, and a fluid ejection die 204, such as the fluid ejection die 100, that is coupled to the fluid reservoir 202. When the fluid cartridge 200 is a print cartridge, the fluid stored in the fluid reservoir 202 may be referred to as a print material, and the fluid reservoir 202 may be referred to as a print material reservoir. The fluid stored in the fluid reservoir 202 can flow to the fluid ejection die 204, which ejects drops of the fluid through a plurality of nozzles 206 toward a print medium.

The fluid cartridge 200 also includes a plurality of EM banks 208-1, . . . , 208-n, collectively referred to as EM banks 208. An EM bank refers to any combination of any number of matrices of EM memory units. In an example, an EM bank includes 64 EM memory units. As illustrated in FIG. 2(a), the memory bank 208-1 includes a plurality of EM memory units 210-1, 210-2, . . . , 210-n, collectively referred to as EM memory units 210, each capable of storing data.

In an implementation, the EM banks 208 are arranged serially. For instance, the EM bank 208-n may be disposed below the EM bank 208-1. Although FIG. 2(a) illustrates the fluid ejection die 204 including two EM banks, in other implementations, the fluid ejection die 204 may include more than two EM banks. In that case, the EM bank 208-1 may be disposed at the top, the EM bank 208-n may be disposed at the bottom, and the remaining EM banks may be disposed one below another serially between the EM banks 208-1 and 208-n. The serial arrangement of the EM banks 208-1, . . . , 208-n one below another forms a group 212 of EM banks. Although FIG. 2(a) illustrates the serial arrangement of the EM banks 208, in other implementations, the EM banks may be arranged differently to form the group 212 of EM banks.

The plurality of EM memory units in each of the EM banks 208 are arranged in the form of a matrix. A matrix of EM memory units refers to an arrangement of EM memory units in a plurality of rows and columns. For example, EM bank 208-1 includes EM memory units 210-1, 210-2, . . . , 210-n arranged in rows and columns. In an example, a matrix of EM memory units includes EM memory units arranged in eight rows and eight columns, i.e., in an 8×8 arrangement.

Each EM memory unit in the EM banks 208 can store data. The data stored can be, for example, binary data, i.e., logic '0' and logic '1'. Since the EM memory units are arranged in the form of matrices, in order to write data to or read data from an EM memory unit, the EM memory unit is to be selected, after which data can be read or written. For selecting the EM memory units, the fluid ejection die 204 includes a plurality of select registers 214-1, ..., 214-n, collectively referred to as select registers 214. The select registers 214 correspond to the select register 106. In other words, although the fluid ejection die 204 is shown to include a plurality of select registers 214, in an implementation, the fluid ejection die 204 includes one select register, such as the select register 106.

Each select register can generate a select signal for facilitating access to the EM memory units in the EM banks 208. The select registers 214 can be disposed together to form a group 216 of select registers. The group 216 of select registers is disposed at one end of the group 212 of EM banks. For example, the group 216 of select registers may be disposed at a top end of the group 212 of EM banks or at a bottom end of the group 212 of memory banks. Here, top end of the group 212 of EM banks refers to a top end of the serial arrangement, i.e., the series, of the EM banks 208 forming the group 212. Similarly, bottom end of the group 212 of EM banks refers to a bottom end of the serial arrangement of the EM banks 208 forming the group 212. In general, an end of a group of EM banks refers to an end of a serial arrangement of the EM banks forming the group.

Figure 2B:
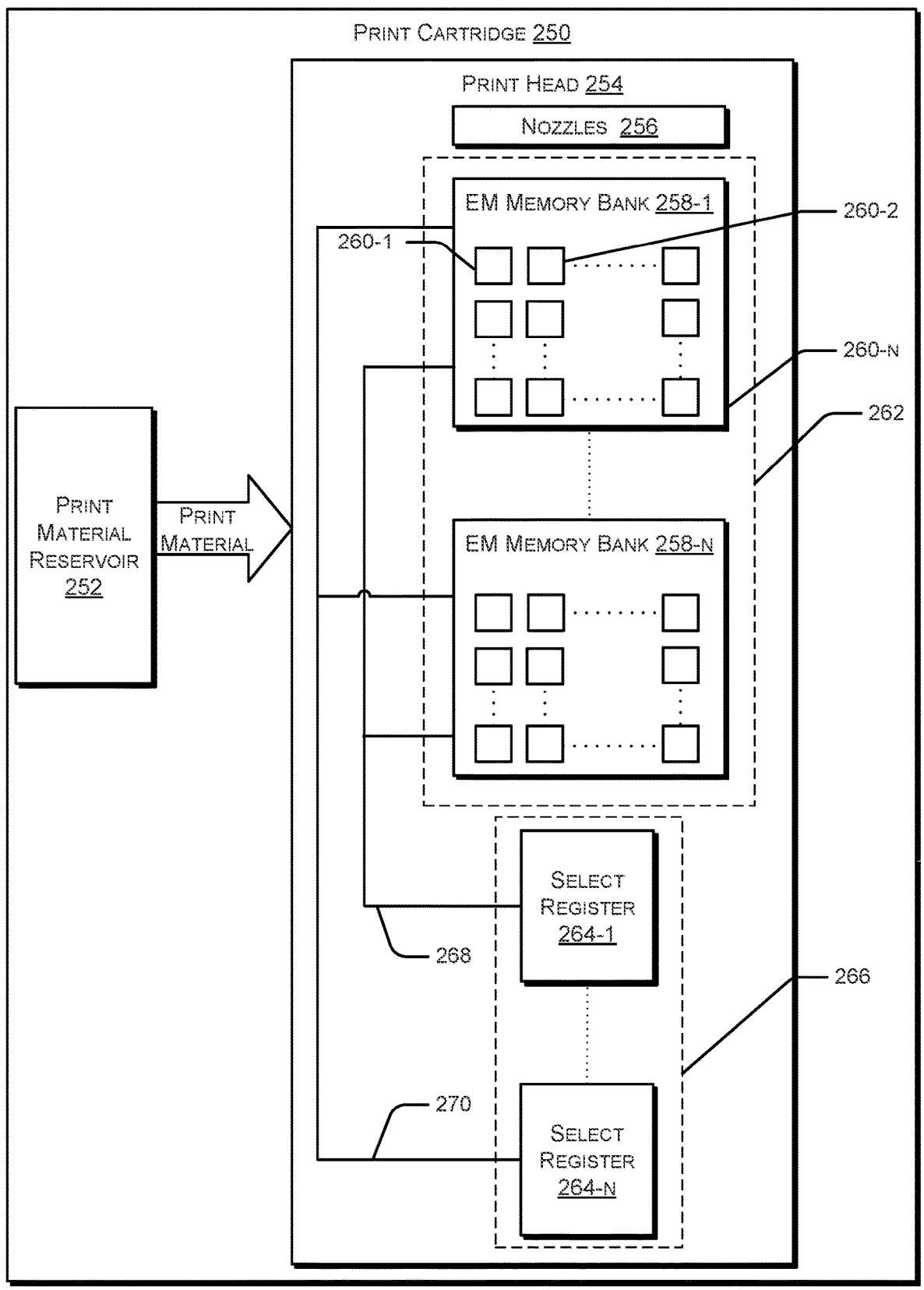
FIG. 2(b) illustrates a print cartridge including a print head, according to an example implementation of the present subject matter.

FIG. 2(b) illustrates a print cartridge 250, according to an example implementation of the present subject matter. The print cartridge 250 may be similar to the fluid cartridge 200. A component of the print cartridge 250 that corresponds to a component of the fluid cartridge 200 is denoted by a reference numeral that is 50 greater than the corresponding component of the fluid cartridge 200. For example, the nozzles 256 in the print cartridge 250 correspond to nozzles 206 in the fluid cartridge 200. Similarly, the print cartridge 250 includes a plurality of select registers 264-1, ..., 264-n (collectively referred to as select registers 264), corresponding to the select registers 214.

In order to provide a select signal generated by a select register to an EM bank, the print head 254 includes a selection line. For instance, the print head 254 includes a selection line 268 to provide the select signal generated by the select register 264-1 to an EM bank. Similarly, the print head 254 includes a selection line 270 to provide the select signal generated by the select register 264-n to an EM bank. Each selection line is disposed on the same side of the group 262 of EM banks. For example, the selection lines 268 and 270 are disposed to the left hand side of the group 262 of EM banks.

The placement of the selection lines 268 and 270 on the same side of the group 262 of EM banks enables utilizing the space between any two adjacent EM banks, which is vacant, for disposing other connection lines. This is described in greater detail with reference to FIG. 4.

In an implementation, the select registers 264 (or 214) includes a row select register, a column select register, and a bank select register. In accordance with the implementation, the selection lines include a row select line, a column select line, and a bank select line.

Figure 3:
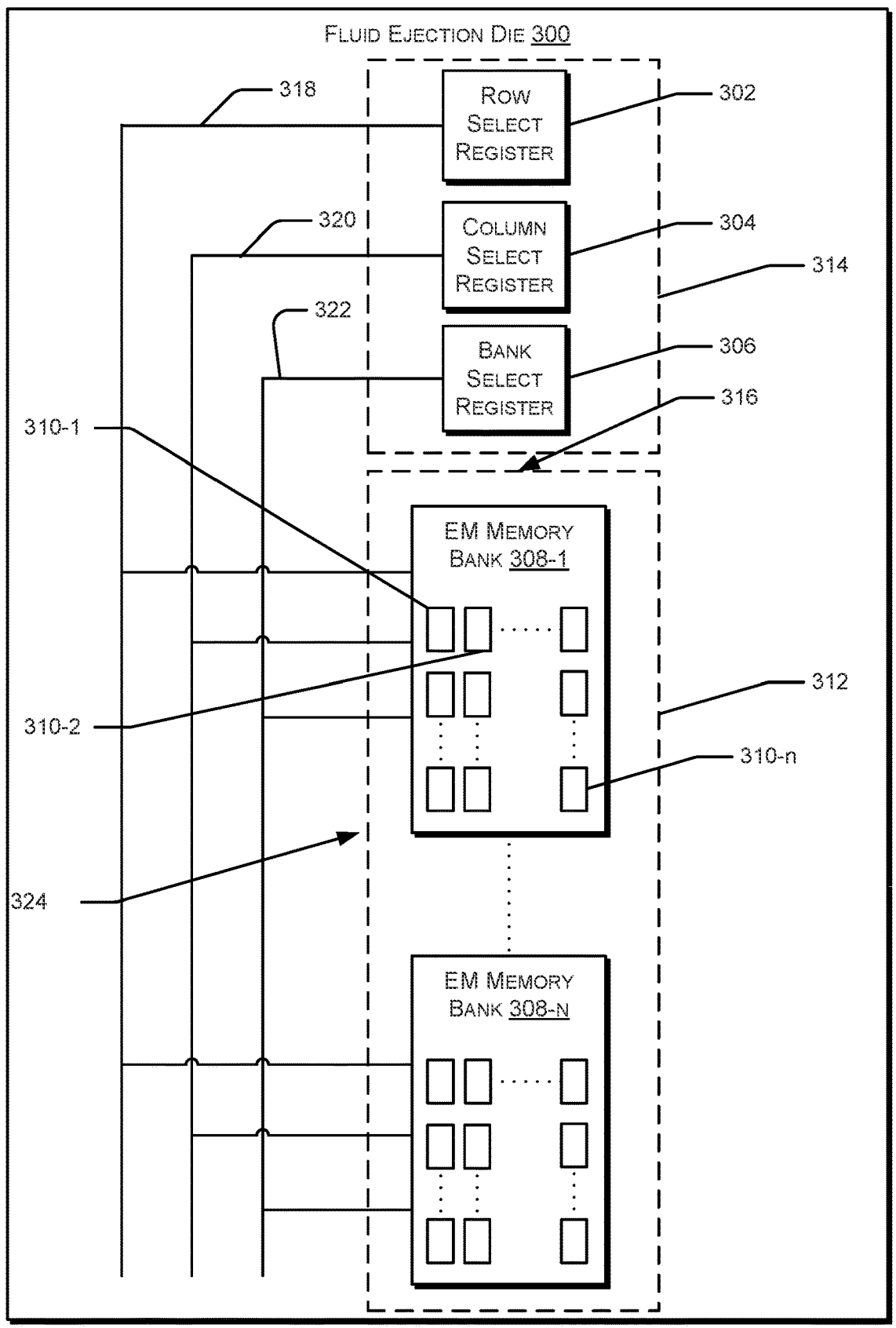
FIG. 3 illustrates a fluid ejection die having a row select register, a column select register, and a bank select register, according to an example implementation of the present subject matter.

FIG. 3 illustrates a fluid ejection die 300 having a row select register 302, a column select register 304, and a bank select register 306, according to an example implementation of the present subject matter. The fluid ejection die 300 may be similar to the fluid ejection dies 100 and 204, and the print head 254. The row select register 302, column select register 304, and bank select register 306 can be used to select EM memory units in EM banks 308-1, ..., 308-n, collectively referred to as EM banks 308.

In an implementation, each EM bank includes one matrix of a plurality of EM memory units. In another implementation, each EM bank includes a plurality of matrices of EM memory units. In such a case, the number of rows in the plurality of matrices may be the same and the number of columns in the plurality of matrices may also be the same. Further, in an example, each matrix of EM memory units may include more number of rows than the number of columns. For example, the EM bank includes two 8×4 matrices of EM memory units, i.e., having EM memory units arranged in eight rows and four columns. In another example, each matrix of EM memory units may include more number of columns than the number of rows.

In an implementation, the EM banks 308 are disposed together to form a group 312 of EM banks. Here, placement of the EM banks together refers to continuous placement of the EM banks without a select register between any two EM banks. The EM banks 308 may be arranged serially one below another, as illustrated in FIG. 3. Similar to the EM banks 308, the row select register 302, the column select register 304, and the bank select register 306 may also be disposed together to form a group 314 of select registers. The group 314 of select registers is disposed adjacent to an end of the group 312 of EM banks. For example, as illustrated in FIG. 3, the group 314 of select registers may be disposed adjacent to a top end 316 of the group 312 of EM banks. In another example, the group 314 of select registers may be disposed adjacent to a bottom end of the group 312 of EM banks.

Each of the row select register 302, the column select register 304, and the bank select register 306 may be a shift register, for example, a serial-in parallel-out shift register. The row select register 302, the column select register 304, and the bank select register 306 may be collectively referred to as select registers. Each of the select registers can include a cascade of flip-flop circuits with two stable states and sharing a common time clock. Each flip-flop circuit can be connected to the data input of the next flip-flop circuit in the cascade, resulting in a circuit that shifts a stored bit array by shifting in the data received at its input and shifting out the last bit in the array at each transition of a clock input. Each flip-flop circuit of a select register may be referred to as a stage. The select registers can include any number of stages. In an example, each of the select registers includes eight stages.

The row select register 302 generates a row select signal, which can be used to select all EM memory units in a single row of a matrix of EM memory units. The row select register 302 can provide row select signal to different rows of EM memory units at different points of time, so that at any point of time, a single row of EM memory units is selected. Since the row select register 302 is connected to several EM banks 308-1, ..., 308-n, the row select signal for a given row can be provided to the corresponding row in all the EM banks 308-1, ..., 308-n. For example, a row select signal to select EM memory units in the second row of matrix of EM memory units is provided to the second row of each of the several EM banks 308-1, ..., 308-n.

In an implementation, the row select signal for each row of a matrix of EM memory units is generated by a different stage of the row select register 302. Therefore, the number of stages in the row select register 302 may be same as the number of rows in the matrices of EM memory units.

Further, if each EM bank has more than one matrix of EM memory units having more rows than columns, for example, two 8×4 matrices of EM memory units, the row select signal for a given row can be provided to the corresponding row in all the matrices. Similarly, if each EM bank has more than one matrix of EM memory units having more columns than rows, the number of stages in the row select register 302 may be a sum of the number of rows in each of the matrix. For example, if the EM bank has two 4×8 matrices of EM memory units, the row select register 302 includes eight (4+4) stages, so that all eight rows can be provided with different row select signals.

The column select register 304 can provide column select signals to different columns of EM memory units at different points of time, so that at any point a single column of EM memory units is selected. Since the column select shift register 304 is connected to several EM banks 308-1, . . . , 308-n, the column select signal for a given column can be provided to the corresponding column in all the EM banks 308-1, . . . , 308-n. For instance, a column select signal to select EM memory units in the first column of matrix of EM memory units can be provided to the first column of each of the several EM banks 308-1, . . . , 308-n.

In an implementation, the column select signal for each column of a matrix of EM memory units is generated by a different stage of the column select register 304. Therefore, the number of stages in the column select shift register 304 may be same as the number of columns in the matrices of EM memory units. Further, if each EM bank has more than one matrix of EM memory units having more columns than rows, for example, two 4×8 matrices of EM memory units, the column select signal for a given column is provided to the corresponding column in all the matrices. Similarly, if each EM bank has more than one matrix having more rows than columns, the number of stages in the column select register 304 may be a sum of the number of columns in each of the matrix. For example, if the EM bank has two 8×4 matrices of EM memory units, the column select register 304 includes eight (4+4) stages, so that all eight columns can be provided with different column select signals.

In an example, each EM bank includes one EM bank having EM memory units in eight rows and eight columns. In another example, each EM bank includes two matrices, each having EM memory units in eight rows and four columns. In a further example, each EM bank includes two matrices, each having EM memory units in four rows and eight columns. In accordance with all the three examples, both the row select register 302 and the column select register 304 include eight stages each.

The bank select register 306 can generate bank select signals at different points of time for different EM banks. The bank select register 306 may include as many stages as the number of EM banks it is connected to. In other words, the bank select shift register 306 may include 'n' stages, as it is connected to n EM banks. In another example, the bank select register 306 includes more than 'n' stages.

An EM memory unit can be accessed for reading or writing when the row on which the EM memory unit is present receives the row select signal, the column on which the EM memory unit is present receives the column select signal, and the EM bank in which the EM memory unit is present receives the bank select signal. Accordingly, the row select register 302, the column select register 304, and the bank select register 306 can generate select signals based on an EM memory unit to be selected. For example, consider a scenario in which the EM memory unit 310-2 is to be selected, say, to write data to it. Since the EM memory unit 310-2 is in the first row and second column of an EM matrix in the first EM bank (308-1), the first stage of the row select register 302 provides the row select signal for the first row, the second stage of the column select register 304 provides the column select signal for the second column, and the first stage of the bank select register 306 generates the bank select signal for the first EM bank 308-1. Such a three-dimensional addressing scheme can be used to select any EM memory unit in any EM bank for reading or writing.

The select signals generated by the select registers can be provided to the EM banks 308-1, . . . , 308-n using selection lines. The selection lines include a row select line 318 connected to the row select register 302 to provide the row select signal, a column select line 320 connected to the column select register 304 to provide the column select signal, and a bank select line 322 connected to the bank select register 306 to provide the bank select signal. All the selection lines 318, 320, and 322 can be routed from the same side of the group 312 of EM banks. For example, the selection lines 318, 320, and 322 can be routed from the left hand side 324 of the group 312 of EM banks. Such a placement of the selection lines 318, 320, and 322 can enable provisioning a single ground line for the EM banks 308-1, . . . , 308-n. The provisioning of the single ground line will be explained with reference to FIG. 4.

Figure 4:
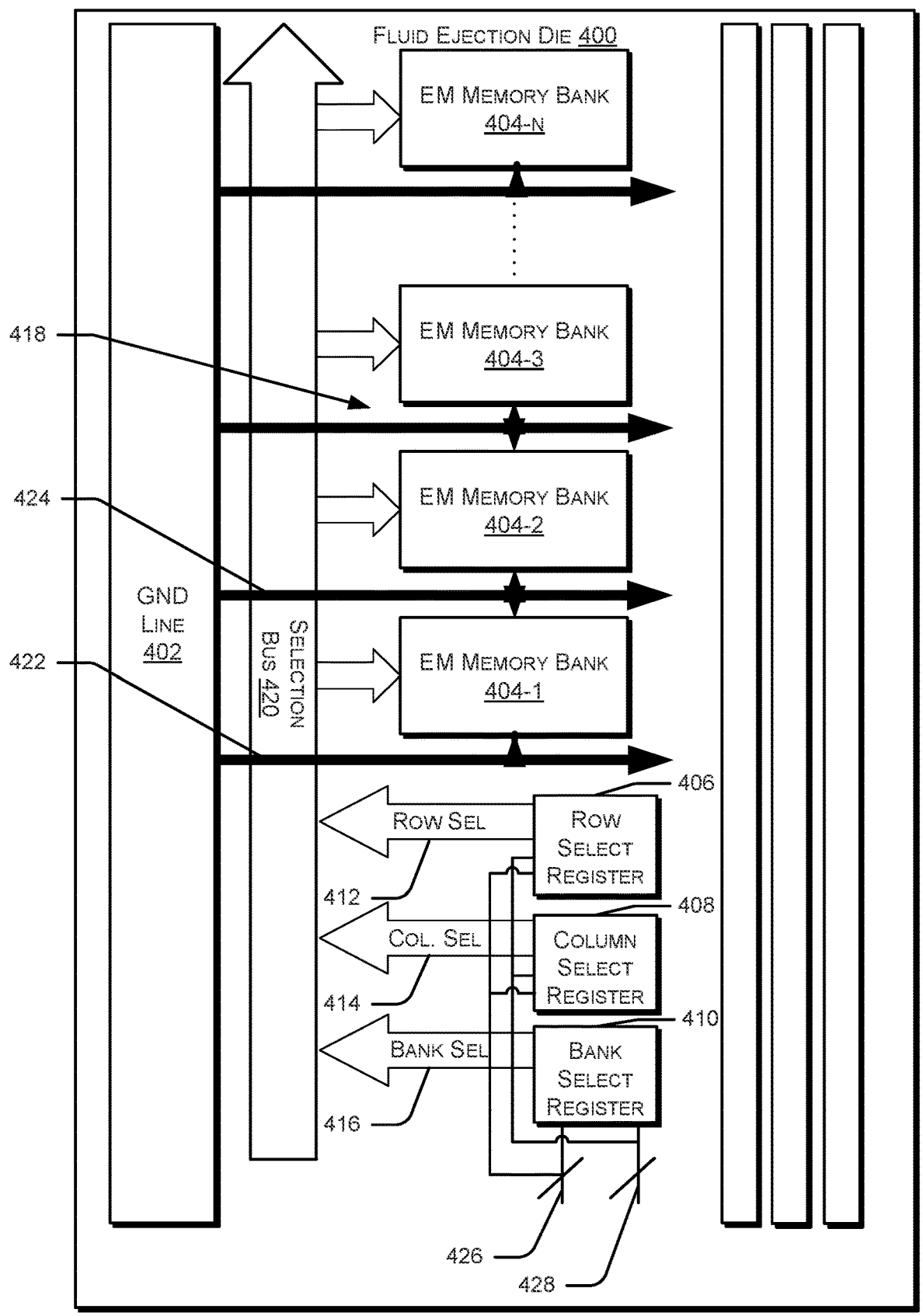
FIG. 4 illustrates provisioning a single ground line for a plurality of EM banks on a fluid ejection die, according to an example implementation of the present subject matter.

FIG. 4 illustrates provisioning a single ground line 402 for a plurality of EM banks 404-1, 404-2, 404-3, . . . , 404-n on a fluid ejection die 400, according to an example implementation of the present subject matter. The ground line 402 can be used to provide grounding connections for the EM memory units in the plurality of EM banks 404-1, 404-2, 404-3, . . . , 404-n, collectively referred to as EM banks 404. As explained earlier, a row select register 406, a column select register 408, and a bank select register 410 are collectively disposed at an end of the group of EM banks 404. Such an arrangement enables disposing the row select line 412, the column select line 414, and the bank select line 416 on the same side, such as left hand side 418, of the group of memory banks 404. Therefore, a selection bus 420 connected to the row select line 412, column select line 414, and bank select line 416, and to the EM banks 404, for providing the select signals to the EM banks 404, can also be provided on the same side of the group of EM banks 404. A side of the group of EM banks 404 refers to a side, such as left hand side and right hand side, of the serial arrangement of the EM banks 404 forming the group of EM banks 404.

Since the row select line 412, the column select line 414, the bank select line 416, and the selection bus 420 are disposed on a single side, such as left hand side 418, of the group of EM banks 404, the space between two adjacent EM banks and between the EM bank 404-1 and the row select register 406 is vacant. This vacant space can be utilized for routing the grounding connection for different sections of the EM banks. Therefore, a single ground line 402 is provisioned on one side of the group of EM banks 404, and ground connecting lines, which connect the EM banks to the ground line 402, can be routed through the vacant space. For instance, referring to FIG. 4, a ground connecting line 422 providing grounding connection to one section of the EM bank 404-1 can be routed through the space between the row select register 406 and the EM bank 404-1. Similarly, a ground connecting line 424 providing grounding connection to another section of the EM bank 404-1 and one section of the EM bank 404-2 can be routed through the space between the EM bank 404-1 and the EM bank 404-2. Since the ground connecting line 424 passes through the gap between the EM banks 404-1 and 404-2, the ground connecting line 424 can provide grounding connection to different sections of the EM banks 404-1 and 404-2. Therefore, a second ground line may not have to be provided on the other side, such as right hand side, of the EM banks 404-1 and 404-2 for providing grounding connections to a different section of the EM banks 404-1 and 404-2. Therefore, the present subject matter provides grounding connections to components of the EM banks 404 using a reduced number of ground lines. This facilitates decreasing dimensions of the die. In an example, a ground line has a thickness of 50 µm. Therefore, by eliminating the provision of a second ground line, the present subject matter reduces dimensions of the fluid ejection die 400 by 50 µm or makes available the free space for other uses, such as provisioning other components on the fluid ejection die 400.

It is to be understood that the order in which the row select register 406, column select register 408, and bank select register 410 are disposed is not to be limited by the illustrated order. Rather they can be disposed in any order.

In an implementation, each EM bank includes a plurality of matrices of EM memory units. For example, each EM bank may include two matrices, each having 32 EM memory units. In accordance with the implementation, the plurality of matrices can be physically separated. For example, similar to the separation provided between the EM bank 404-1 and the EM bank 404-2, a separation may be provided between different matrices in the same EM bank. In such a case, similar to the ground connecting lines 420 and 422 between EM banks, ground connecting lines can be provided in the separation between different matrices of an EM bank for providing grounding connections to different sections of the matrices of EM memory units.

Although FIG. 4 illustrates having a separate select register for selecting rows, columns, and EM banks, in some implementations, one select register can be used to select a combination of rows, columns, and EM banks. For example, one select register may generate both row select and column select signals, while another select register generates bank select signal. In another example, one select register, such as the select register 106, may select generate all of the row select, column select, and bank select signals.

As explained earlier, the select registers, i.e., the row select register 406, the column select register 408, and the bank select register 410, generate select signals for selection of EM memory units. The select signals are generated based on one or more input signals. The one or more input signals may be generated by a controller, such as a printer controller, on a device, such as a printer, on which the select registers are disposed.

In an implementation, the one or more signals include register select signals S1-S4 and data signals D1-D3. Each select register may receive different register select signals. In other words, the row select register 406 may receive S11-S41, the column select register 408 may receive register select signals S12-S42, and the bank select register 410 may receive register select signals S13-S43. The register select signals S1-S4 can be used to pre-charge and advance the select registers. For example, the row select register 406, which may be a shift register, can be advanced by repeatedly pulsing the select signals S11, . . . , S41 where each cycle through the four select signals S11, . . . , S41 causes the row select register 406 to advance by one stage. The select signals S11, . . . , S43 can be independent signals or a common signal. For example, the select signals S11, S12, and S13 can be a common signal instead of distinct signals. The same can be true of select signals S21, S22, S23, select signals S31, S32, S33, and select signals S41, S42, S43. The data signals D1-D3 can serve as initiating signals and can communicate the row and column address of an EM memory unit. The data input by the data signals D1-D3 can be arbitrarily assigned to any of the select registers 406-410 such that a particular select register is not limited to receiving a particular type of data input.

The register select signals S1-S4 are provided through register select lines 426 and the data signals D1-D3 are provided through register data lines 428. Since the select registers are collectively disposed at an end of group of the EM banks 404, the register select lines 426 and the register data lines 428 can also be provided for a short length spanning the select registers. For example, referring to FIG. 4, the register select lines 426 and the register data lines 428 span the length between the row select register 406 and the bank select register 410.

Thus, the register select lines 426 and the register data lines 428 are not provided throughout the length spanned by the EM banks and the select registers. Further, the register select lines and the register data lines are not routed through a side of the EM banks, thus helping to reduce the size of the fluid ejection die 400. In an example where the number of input signals is seven (three data signals, D1-D3 and four register select signals, S1-S4) and where each input signal line is 8 µm wide and a spacing of 2.5 µm is to be provided between two input signals, the die width can be decreased by about 73.5 µm, since the input signal lines are provided at an end of the EM banks 404.

In an implementation, placement of the select registers at the end of group of EM banks also enables reducing incidences of snapback, in which avalanche breakdown or impact ionization provides a sufficient base current to turn on a transistor. Snapback may be caused when a parasitic NPN transistor, formed by a substrate on which transistors in the EM banks and select register are formed and the drain and source terminals of the transistors, is turned on. The turn on of the parasitic NPN transistor occurs when the resistance of the substrate and base current provides a sufficient base voltage that forward biases the parasitic NPN transistor. This snapback causes the fluid ejection die to draw more than rated current, which may cause the device, such as the print head, to malfunction.

In order to prevent incidences of snapback, conventionally, subtap contacts are provided that include electrically conductive lines to connect the substrate to ground. This enables draining the charge that is built-up in the substrate, for example, charge that is built-up about the transistors, thereby reducing the possibility of snapback. The higher the number of the subtap contacts, lower is the resistance of the substrate, and therefore, lower is the possibility of snapback.

Figure 5:
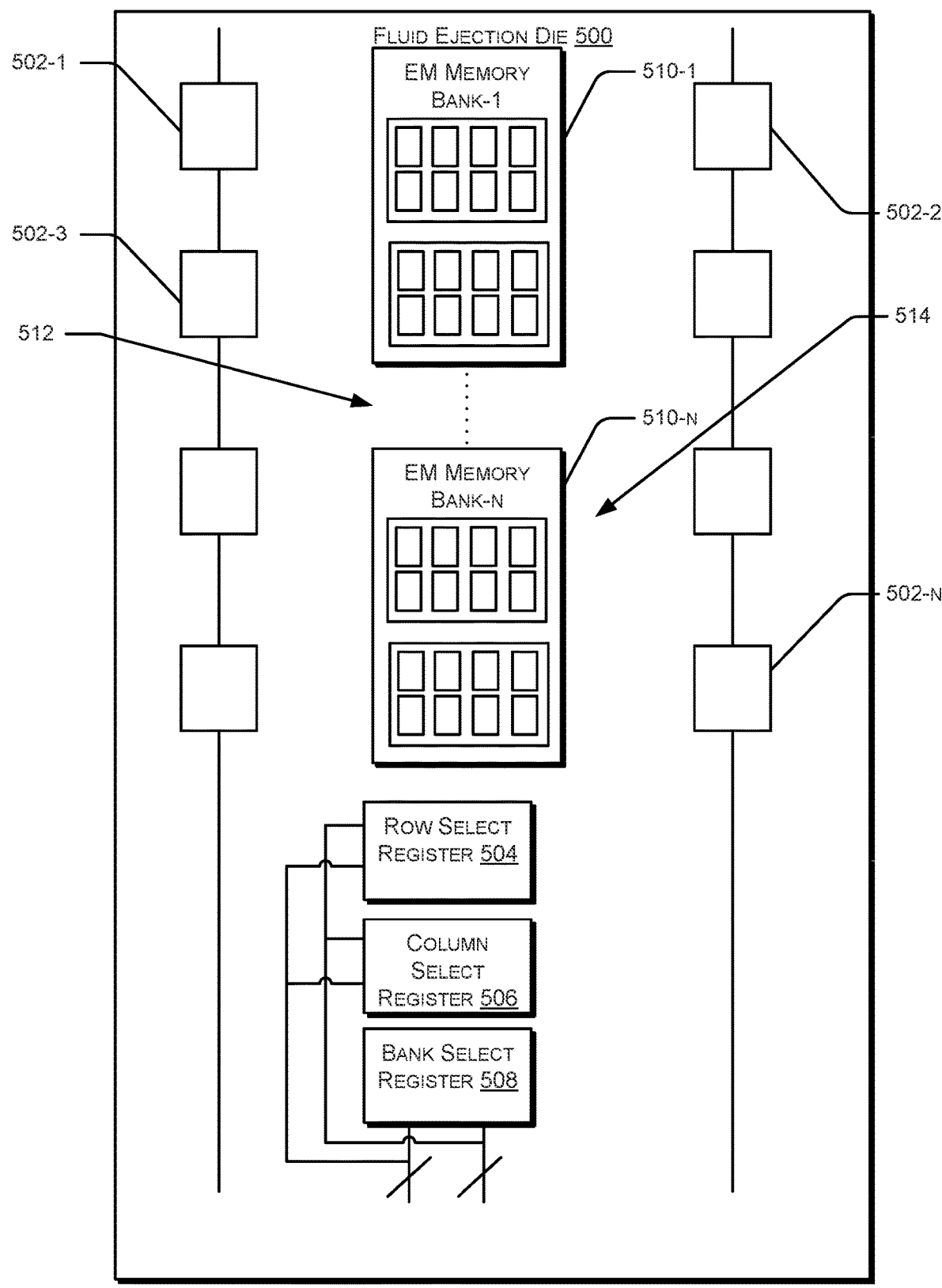
FIG. 5 illustrates placement of a plurality of subtap contacts on a fluid ejection die, according to an example implementation of the present subject matter.

FIG. 5 illustrates placement of a plurality of subtap contacts 502-1, 502-2, 502-3, . . . , 502-n on a fluid ejection die 500, according to an example implementation of the present subject matter. Since the row select register 504, the column select register 506, and the bank select register 508 are disposed at an end of the group of EM banks 510-1, . . . , 510-n, collectively referred to as the EM banks 510, the area on either side of the EM banks 510, i.e., on the left hand side 512 and the right hand side 514, is vacant. Therefore, subtap contacts can be disposed on both sides of the EM banks 510-1, . . . , 510-n. In particular, since the area on either side of the EM banks 510-1, . . . , 510-n is vacant, therefore, for each subtap contact disposed on one side, for example left hand side 512, of an EM bank, a parallel subtap contact can be disposed on the other side, for example right hand side 514, of the EM bank. Referring to FIG. 5, for a subtap contact 502-1 disposed on the left hand side 512 of the EM bank 510-1, a subtap contact 502-2 is disposed on the right hand side 514 and parallel to the subtap contact 502-1.

Since the present subject matter enables provisioning a large number of subtap contacts, the present subject matter enables a considerable decrease in the resistance of the substrate, thereby proving effective in reducing snapback. Further, the increase in the number of subtap contacts also enables reducing noise from the parasitic NPN transistor. In other words, the present subject matter can reduce sensitivity of a print head to substrate resistivity.

Although implementations of aspects of disposing memory banks and select registers have been described in language specific to structural features and/or methods, it is to be understood that the present subject matter is not necessarily limited to the specific features or methods described. Rather, the specific features and methods are disclosed and explained as example implementations.

We claim:

1. A memory device, comprising:
a plurality of memory banks arranged in a line to form a group of memory banks, each memory bank having memory units; and
at least one select register, wherein the at least one select register is to generate a select signal to access the memory units in the plurality of memory banks,
wherein the at least one select register is disposed at an end of the group of memory banks and in line with the line of memory banks.

2. The memory device of claim 1, wherein the memory units are electrically programmable read only memory (EM) memory units.

3. The memory device of claim 1, wherein the at least one select register comprises:
a row select register to generate a row select signal;
a column select register to generate a column select signal; and
a bank select register to generate a bank select signal,
wherein the row select signal, the column select signal, and the bank select signal are routed to the plurality of memory banks from the same side of the group of memory banks.

4. The memory device of claim 1, comprising a plurality of subtap contacts on either side of the group of memory banks, wherein, for each subtap contact on one side of the group of memory banks, a parallel subtap contact is disposed on other side of the group of memory banks.

5. The memory device of claim 1, comprising:
a single ground line on one side of the group of memory banks; and
a ground connecting line to connect the single ground line to two adjacent memory banks.

6. The memory device of claim 5, wherein the ground connecting line runs between the two adjacent memory banks.

7. The memory device of claim 1, further comprising a plurality of grounding contacts to electrically connect a substrate of the memory device to ground to remove accumulated electrical charge from the substrate.

8. The memory device of claim 7, wherein a line of the grounding contacts is disposed along each opposite side of the line of memory banks.

9. The memory device of claim 1, wherein the at least one select register is a single select register to select a combination of a row, a column and a memory bank.

10. The memory device of claim 1, wherein the at least one select register is a shift register.

11. The memory device of claim 1, the memory device structured for use with a fluid ejection die, wherein the line of memory banks is arranged corresponding to a length of the fluid ejection die.

12. The memory device of claim 11, further comprising:
register select lines; and
register data lines;
wherein the register select lines and register data lines extend from an edge of the fluid ejection die to the at least one select register and do not extend beyond the at least one select register.

13. A memory device comprising:
a plurality of electrically programmable read only memory (EM) banks arranged to form a group of EM banks, wherein each EM bank in the plurality of EM banks comprises EM memory units arranged in rows and columns;
a plurality of select registers to select a row of EM memory units, a column of EM memory units, and an EM bank of the plurality of EM banks,
wherein the plurality of EM banks are arranged serially in a line, and the plurality of select registers is disposed together to form a group of select registers, and wherein the group of select registers is disposed on the same line as the EM banks and adjacent to an end of the line of EM banks.

14. The memory device of claim 13, wherein the plurality of select registers comprises a row select register, a column select register, and a bank select register, wherein the row select register is to generate a row select signal to select a row of the EM memory units, the column select register is to generate a column select signal to select a column of the EM memory units, and the bank select register is to generate a bank select signal to select an EM bank of the plurality of EM banks, and wherein the row select signal, the column select signal, and the bank select signal are provided to the plurality of EM banks from the same side of the group of EM banks.

15. The memory device of claim 14, comprising:
a row select line connected to the row select register to provide the row select signal;
a column select line connected to the column select register to provide the column select signal;
a bank select line connected to the bank select register to provide the bank select signal; and
a selection bus connected to the row select line, the column select line, the bank select line, and the plurality of EM banks,
wherein the row select line, the column select line, the bank select line, and the selection bus are on the same side of the group of EM banks.

16. The memory device of claim 13, comprising a plurality of subtap contacts on either side of the group of memory banks, wherein, for each subtap contact on one side of the group of memory banks, a parallel subtap contact is disposed on other side of the group of memory banks.

17. The memory device of claim 13, comprising:
a single ground line on one side of the group of memory banks; and
a ground connecting line to connect the single ground line to two adjacent memory banks.

18. A memory device comprising:
a plurality of electrically programmable read only memory (EM) banks arranged serially to form a group of EM banks, each EM bank having several EM memory units;
a plurality of select registers, wherein each select register of the plurality of select registers is to generate a select signal for facilitating access to EM memory units in the plurality of EM banks, wherein the plurality of select registers is disposed together at an end of the group of EM banks; and
a selection line connected to each select register of the plurality of select registers to provide a select signal from the select register to each of the plurality of EM banks, wherein selection line connected to each of the plurality of select registers is disposed on same side of the group of EM banks.

19. The memory device of claim 18, wherein the plurality of select registers comprises a row select register, a column select register, and a bank select register, and wherein the selection line connected to each of the plurality of select registers comprises a row select line, a column select line, and a bank select line.

20. The memory device of claim 18, comprising a selection bus connected to each selection line and to each of the plurality of memory banks, wherein the selection bus is disposed on the same side of the group of EM banks as each selection line.

* * * * *